(12) United States Patent
Tung

(10) Patent No.: US 6,214,674 B1
(45) Date of Patent: Apr. 10, 2001

(54) METHOD OF FABRICATING HIGH VOLTAGE DEVICE SUITABLE FOR LOW VOLTAGE DEVICE

(75) Inventor: Ming-Tsung Tung, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/203,780

(22) Filed: Dec. 2, 1998

(51) Int. Cl.⁷ .................................. H01L 21/8234
(52) U.S. Cl. .................... 438/275; 438/228; 438/232; 438/298
(58) Field of Search ................... 438/275, 276, 438/200, 228, 227, 232, 298

(56) References Cited

U.S. PATENT DOCUMENTS

| | | | |
|---|---|---|---|
| 4,818,719 | * 4/1989 | Yeh et al. ........................ | 438/200 |
| 5,545,577 | * 8/1996 | Tada ................................ | 438/232 |
| 5,550,064 | * 8/1996 | Yang ............................... | 438/228 |
| 5,622,878 | * 4/1997 | Beasom ........................... | 438/218 |
| 5,789,788 | * 8/1998 | Ema et al. ....................... | 257/371 |
| 5,965,921 | * 10/1999 | Kojima ........................... | 257/369 |
| 5,976,922 | * 11/1999 | Tung ............................... | 438/228 |

* cited by examiner

Primary Examiner—Michael Trinh

(57) ABSTRACT

A method of fabricating a high-voltage device suitable for a low-voltage device. A well formed by ion implantation in the high-voltage device region serves as a drift region for fabricating the high-voltage device. Therefore, one mask is used to define a portion of the wells of the high-voltage device region and the wells of low-voltage device region. It is not necessary to use multiple masks to pattern the well of the low-voltage device region and the drift region of the high-voltage device region.

18 Claims, 6 Drawing Sheets

METHOD OF FABRICATING HIGH VOLTAGE DEVICE SUITABLE FOR LOW VOLTAGE DEVICE

BACKGROUND OF THE INVENTION

1. Field of the Invention

The invention relates to a method of fabricating a high-voltage device that is suitable to apply in a low-voltage device, and more particularly to a method of fabricating a high-voltage device wherein a well formed by ion implantation is used as a drift region.

2. Description of the Related Art

As the size of the device is reduced, the reduced channel length shortens the desired time of the transistor during operation. The problem of short channel effect due to the reduced channel length gradually becomes more serious. According to the formula of electrical field=voltage/length, when the channel length of the transistor is reduced and the voltage is fixed, the energy of the electrons in the channel rises due to the enhancement of the electrical field. On the other hand, the electrical field is also enhanced, raising the energy of the electrons in the channel, when the voltage is increased and the channel length is fixed. Both of these situations may cause electrical breakdown.

For example, devices used for drivers of digital versatile disk (DVD) and liquid crystal display (LCD) need to endure a high voltage of about 12–30V. Generally, a high-voltage device uses an isolation region and a drift region under the isolation region to increase the distance between a source/drain region and a gate, so that the device can be operated normally under a high voltage.

FIGS. 1A–1D are schematic, cross-sectional views of fabrication of a high-voltage device as known in the prior art. Referring to FIG. 1A, an N-type semiconductor substrate (not shown) is provided, and a well 10 having P-type impurity is formed in the semiconductor substrate. A pad oxide layer 20 is formed on the well 10, and a silicon nitride layer 30 is then formed on the pad oxide layer 20.

Referring to FIG. 1B, the silicon nitride layer 30 is patterned by a photoresist layer 40. A portion of the silicon nitride layer 30 is then removed to form a silicon nitride layer 50 on the pad oxide layer 20, and a portion of the well 10 is exposed. N-type ions are implanted into the exposed well 10 to form a drift region 60 having N-type ions.

Referring to FIG. 1C, the photoresist layer 40 is removed. Using the silicon nitride layer 50 as a mask, a field oxide layer 70 with a bird's beak of each side of the silicon nitride layer 50 is grown on the drift region 60. The N-type ions in the drift region 60 are driven in the well 10 at a high temperature to broaden the drift region 60.

Referring to FIG. 1D, the silicon nitride layer 50 and the pad oxide layer 20 are then removed. A thin oxide layer 80 is formed on the well 10 to serve as a gate oxide layer. A polysilicon layer 90 serving as a gate is formed on the well 10 by photolithography. Ion implantation with N-type ions of low dosage and high energy is performed on the well 10, and a drift region 100 having N-type ions is then formed by driven-in thermally. N-type ions having high dosage and low energy are implanted into the well 10 beside the gate 90 to form a source region 110 and a drain region 120.

As shown in FIG. 1D, in order to raise the breakdown voltage of the device, it is necessary to form multiple masks to fabricate the structure of the drift region. Fabrication of masks for the drift region consumes time and money, to the extent that throughput cannot be increased.

SUMMARY OF THE INVENTION

It is therefore an object of the invention to provide a method of fabricating a high-voltage device that is compatible with the process of fabricating a low-voltage device. The fabrication of masks can be reduced in the high-voltage device process and the cycle time can also be decreased.

To achieve these objects and advantages, and in accordance with the purpose of the invention, as embodied and broadly described herein, the invention is directed towards a method of fabricating a high-voltage device suitable for a low-voltage device. A substrate of a first type impurity is provided, and a first well of a second type impurity is formed within the substrate in a high-voltage device region. Second wells of the first type impurity are formed within the first well, and a third well of the first type impurity is formed within the substrate in a low-voltage device region wherein the second wells serve as a drift region of the high-voltage device region. A field implantation of the second type impurity is performed on the substrate and field oxide layers are formed on the substrate. A first gate is formed on the substrate between field oxide layers of the high-voltage device region, and a second gate is formed on the substrate of the low-voltage device region. A first source/drain region is formed within the second wells beside the field oxide layers of the first gate, and the second source/drain region is formed beside the second gate. A doped region of the first type impurity is formed within the second well in the low-voltage device region.

It is to be understood that both the foregoing general description and the following detailed description are exemplary and explanatory only and are not restrictive of the invention, as claimed.

DESCRIPTION OF THE PREFERRED EMBODIMENTS

Figure 1A:
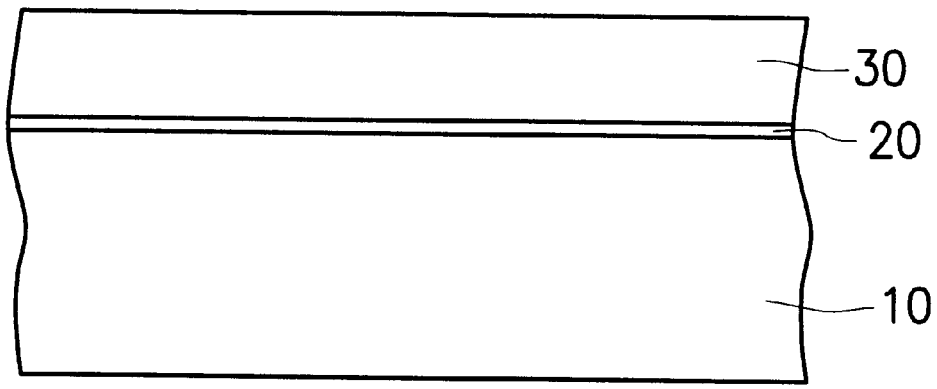
FIGS. 1A–1D are schematic, cross-sectional views illustrating the fabrication of a high-voltage device as known in prior art.
Figure 1B:
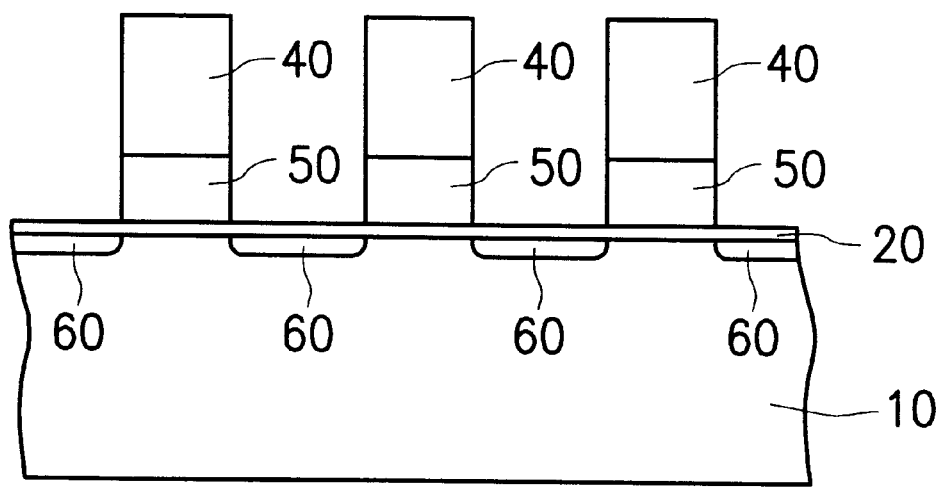
Figure 1C:
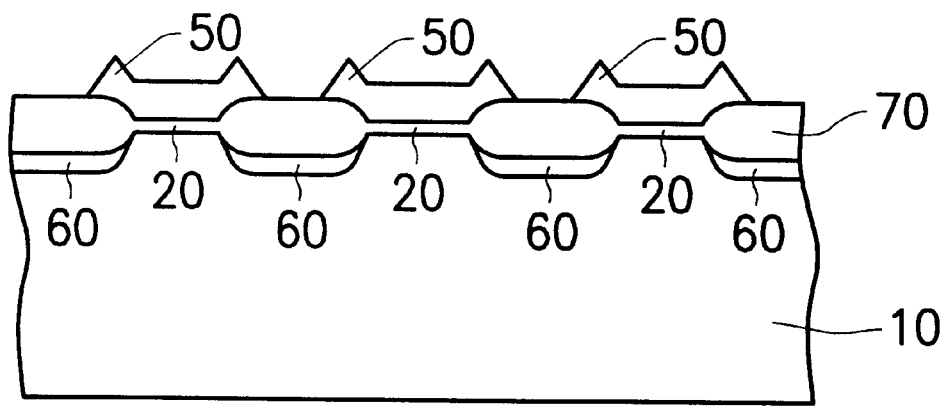
Figure 1D:
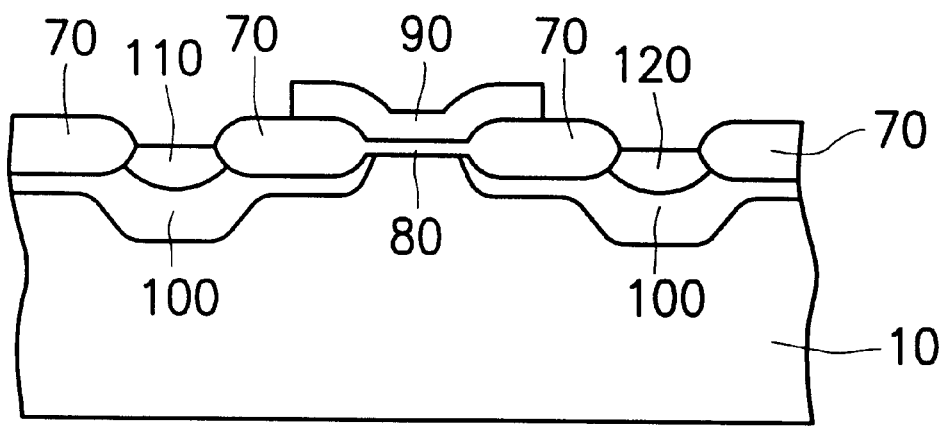
Figure 2A:
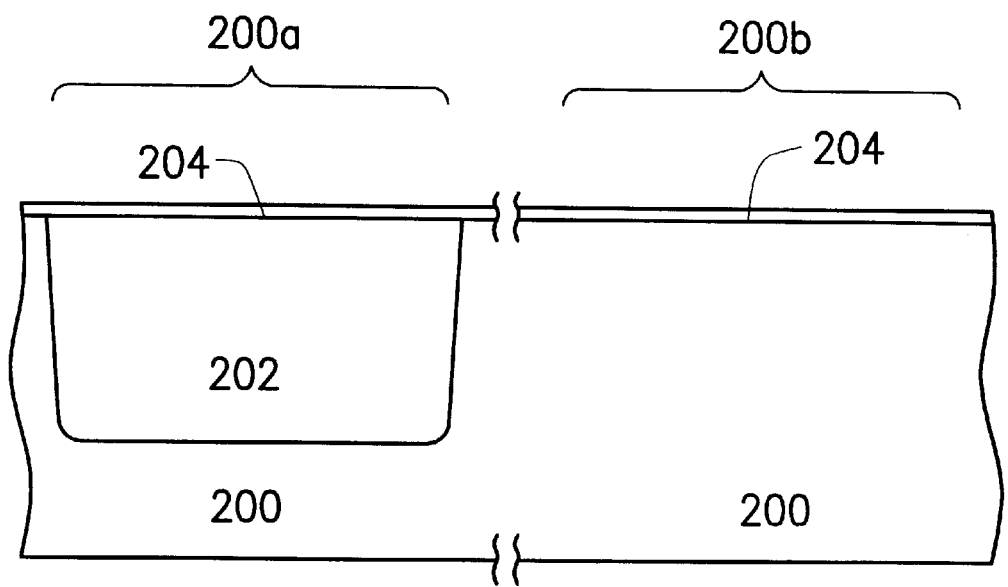
FIGS. 2A–2G are schematic, cross-sectional views illustrating the fabrication of a high-voltage device suited for a low-voltage device in a preferred embodiment according to the invention.

Referring to FIG. 2A, a high-voltage device region 200a and a low-voltage device region 200b are defined on a semiconductor substrate 200 having a first type impurity. Thermal oxidation is performed on the semiconductor substrate 200 to form an oxide layer 204. Photolithography and ion implantation are performed to implant a second type impurity into the high-voltage device region 200a, and a well 202 having the second type impurity is formed within the semiconductor substrate 200 in the high-voltage region 202a. The impurities in the well 202 are driven at a high temperature to diffuse into the substrate 200 deeply. If the first type impurity is N-type ions, the second type impurity is P-type ions. If the first type impurity is P-type ions, the second type impurity is N-type ions.

Figure 2B:
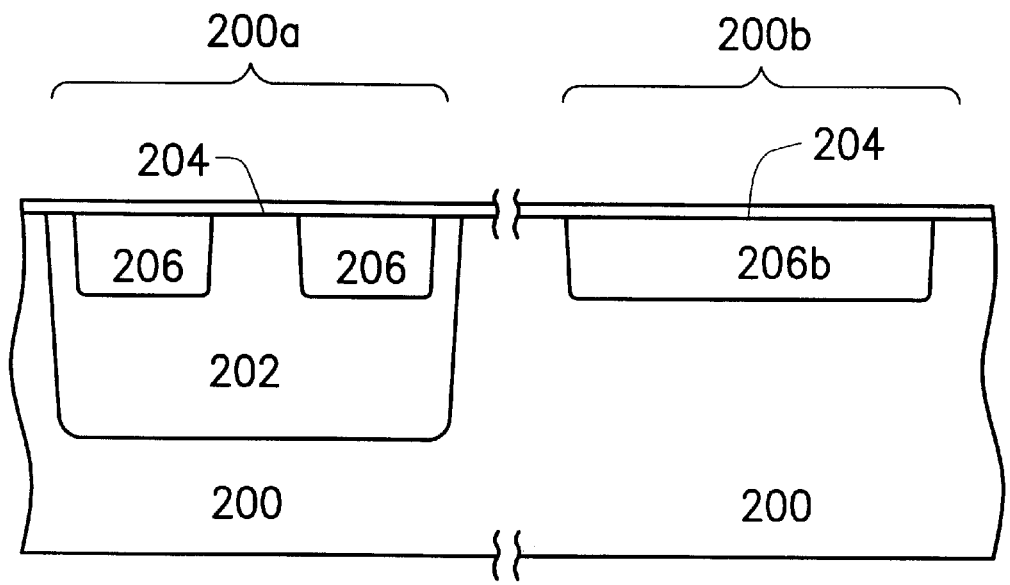

Referring to FIG. 2B, the first type impurity is implanted into the well 202 of the high-voltage region 200a by photolithography and ion implantation. Two wells 206 having the first type impurity are formed within the well 202 of the high-voltage region 202a and serve as a drift region of a source/drain region of the high-voltage device region. A well 206b having the first type impurity is also formed in the substrate 200 in the low-voltage device region 200b. The implanted impurities in these wells are driven into the semiconductor substrate 200 at a high temperature.

Figure 2C:
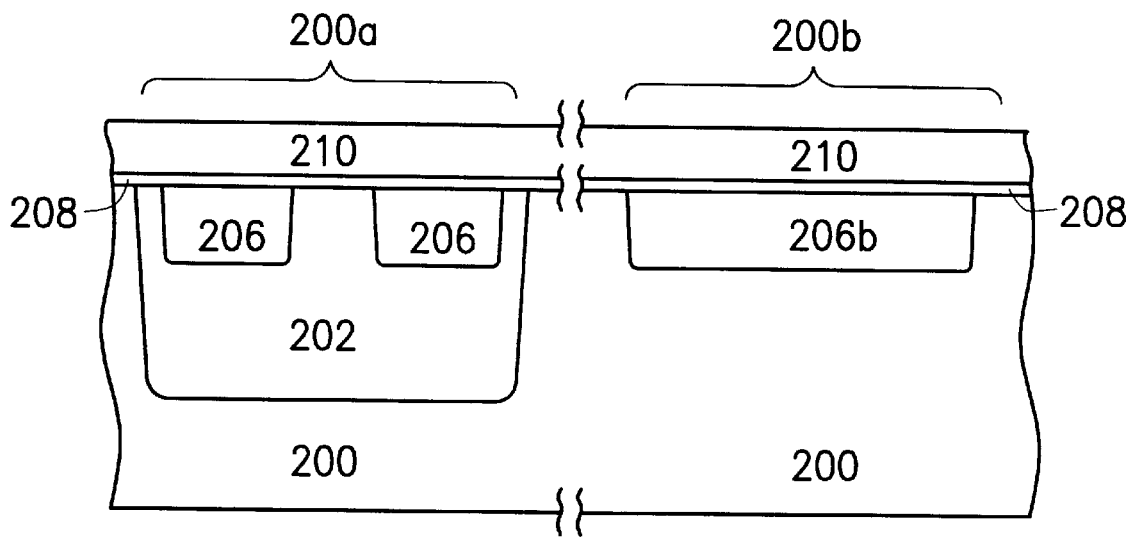

Referring to FIG. 2C, the oxide layer 204 is removed by etching. A pad oxide layer 208 is thermally formed on the semiconductor substrate 200 in an oxygen-filled environment. A silicon nitride layer ($Si_3N_4$) 210 is deposited on the pad oxide layer 208 by low pressure chemical vapor deposition (LPCVD).

Figure 2D:
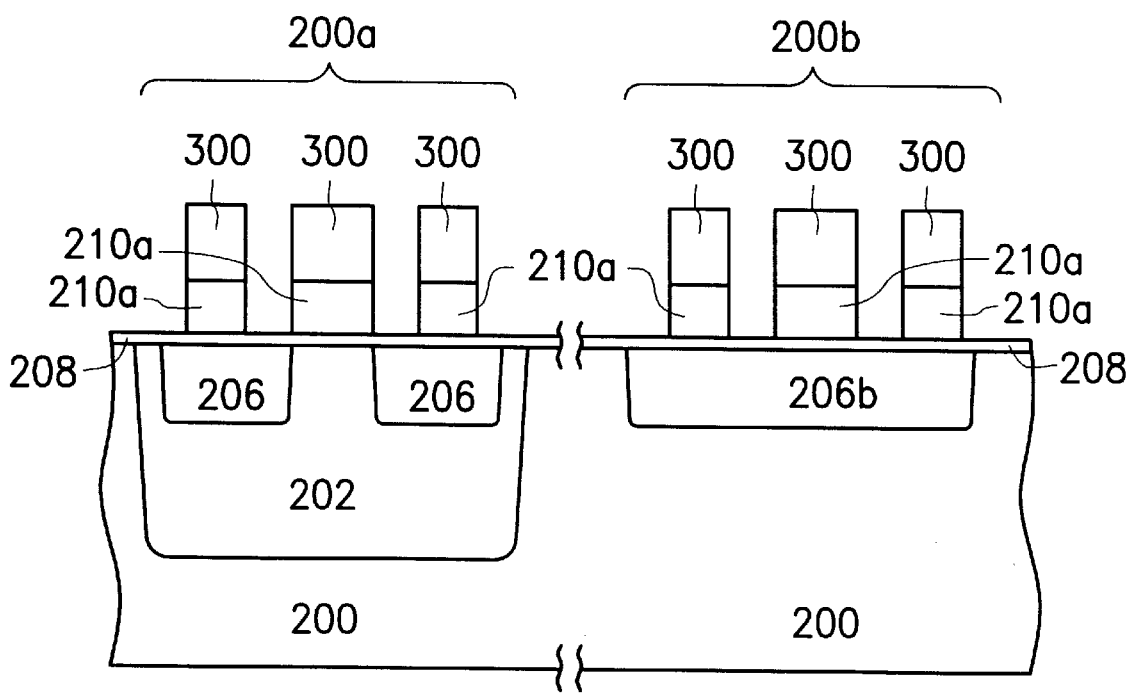

Referring to FIG. 2D, portions of the silicon nitride layer 210 are removed by photolithography, and the silicon nitride layer 210a under the photoresist layer 300 is left to fabricate the field oxide layer subsequently.

Figure 2E:
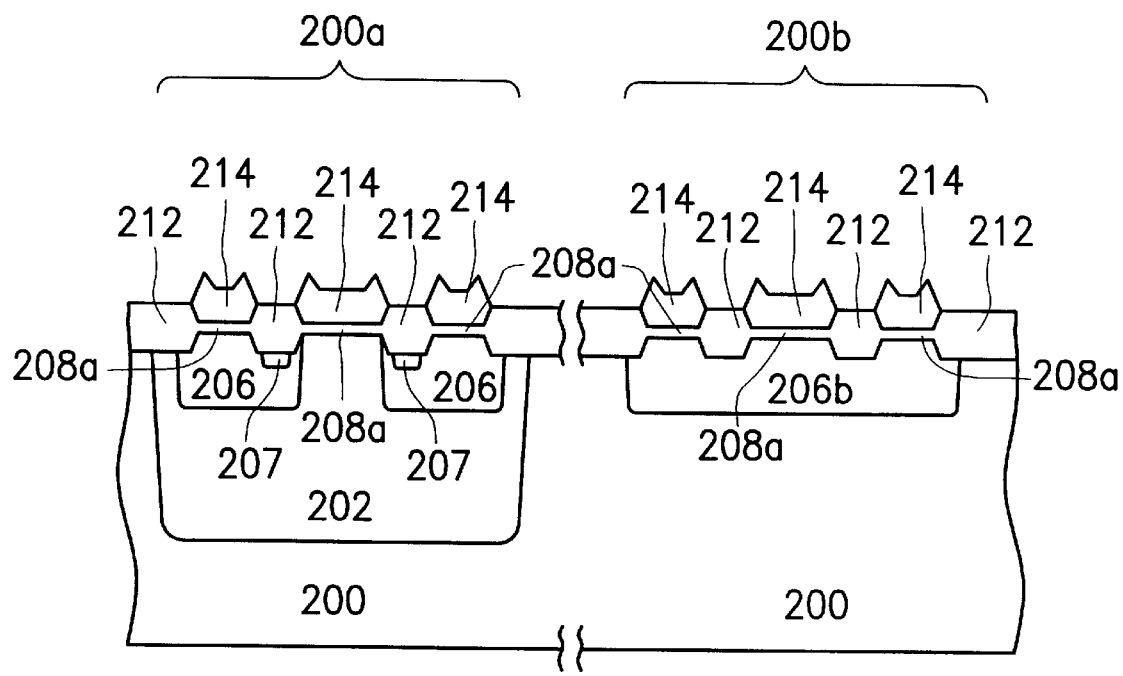

Referring to FIG. 2E, a well 207 of the second ion impurity is formed within the well 206 by ion implantation. Wet oxidation is performed on the wafer in a furnace, and a field oxide layer 212 is grown on the wafer in the furnace with moisture. Because the moisture and oxygen cannot penetrate the silicon nitride layer 210a, there is no silicon oxide layer grown on the pad oxide layer 208 covered by the silicon nitride layer 210a. A portion of the exposed pad oxide layer 208 in FIG. 2D is oxidized to form the field oxide layer 212 with a bird's beak in the FIG. 2E. The well 207 of the second ion impurity is under the field oxide layer 212.

Figure 2F:
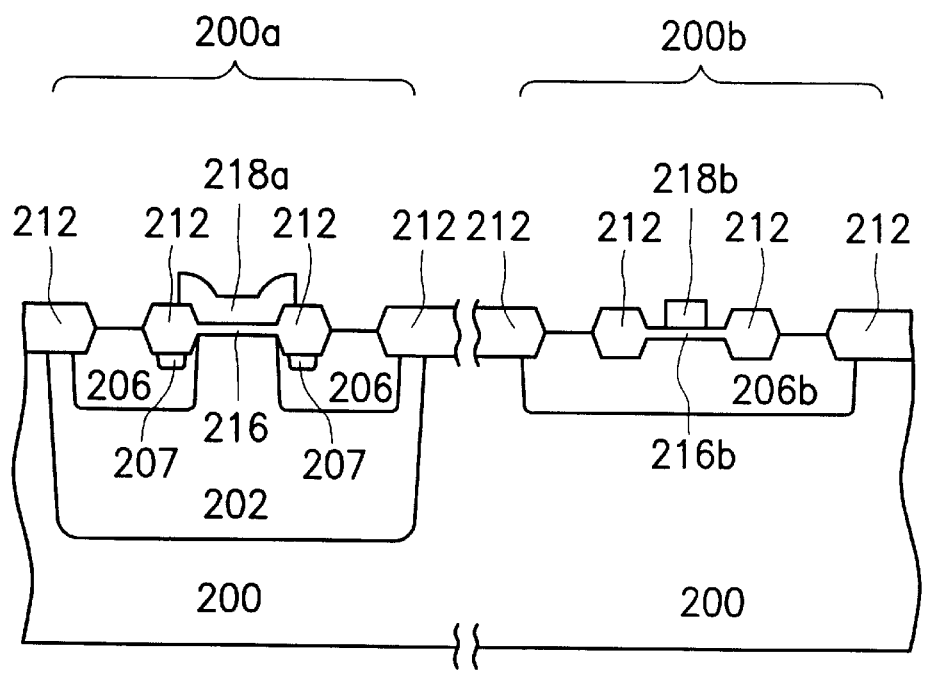

Referring to FIG. 2F, the silicon nitride layer 214 and the pad oxide layer 208a are both removed by wet etching. A thin oxide layer of good quality serving as a gate oxide layer 216 is formed on the field oxide layer 212 and the well 202 in the high-voltage device region 200a by dry oxidation. Simultaneously, a thin oxide layer of good quality serving as a gate oxide layer 216b is formed on the field oxide layer 212 and the well 206b in the low-voltage device region 200b.

A polysilicon layer is formed on the gate oxide layers 216 and 216b, and a photolithography technique is performed to remove a portion of the polysilicon layer. Gates 218a and 218b of the high-voltage device region 200a and the low-voltage device region 200b, respectively, are thus formed on the substrate 200.

Figure 2G:
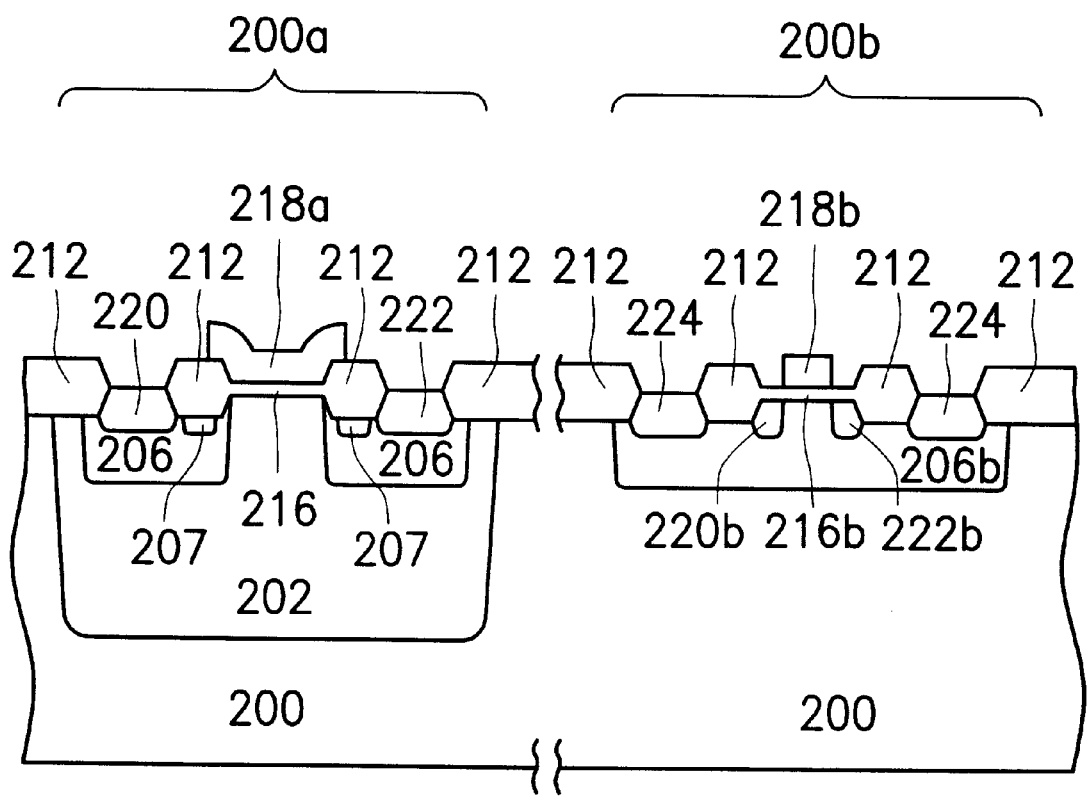

Referring to FIG. 2G, impurities of the first type with high dosage and low energy are implanted in the well 206 beside the field oxide layer 212 of the gate 218a in the high-voltage device region 200a. The doped region 224 of the first type impurity is formed on the well 206b between the field oxide layer 212 in the low-voltage device region 200b. Impurities of the second type with high dosage and low energy are implanted in the well 206b beside the gate 218b in the low-voltage device region 200b. Source/drain regions 220 and 222 in the high-voltage device region 200a, source/drain regions 220b and 222b in the low-voltage device region 200b, and doped regions 224 are thus formed.

As described above in a preferred embodiment of the invention, the advantages of the invention are described hereafter.

(1) The well formed by ion implantation is used as a drift region of the high-voltage device region. A portion of the wells of the high-voltage device region and the wells of low-voltage device region can be defined by only one mask simultaneously; therefore, the cost to fabricate the mask for the drift region is reduced.

(2) One mask is used to define a portion of the wells of the high-voltage device region and the wells of low-voltage device region simultaneously, and therefore the high-voltage device region and the low-voltage device region use the same process to reduce the process time.

(3) Since the well formed by ion implantation is used as a drift region of the high-voltage device, monitors with different voltages can be driven by the varied conductive characteristics of the ions in the well.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a high-voltage device suitable for a low-voltage device, comprising:

providing a semiconductor substrate of a first type impurity, in which a high-voltage device region and a low-voltage device region are defined;

forming a first well of a second type impurity in the high-voltage device region;

forming a plurality of second wells of the first type impurity within the first well and forming a third well of the first type impurity in the low-voltage device region wherein the second wells serve as a drift region of the high-voltage region;

performing a field implantation of the second type impurity to form a plurality of fourth wells of the second type impurity within the second wells;

forming a plurality of field oxide layers above the fourth wells in the high-voltage device region and above the semiconductor substrate in the low-voltage device region;

forming a first gate between the field oxide layers above the first well and forming a second gate between the field oxide layers above the third well; and forming a first source/drain region of the first type impurity between the field oxide layers within the second wells and forming a second source/drain region of the second type impurity beside the second gate within the third well.

2. The method according to claim 1, wherein the first type impurity is P-type ions and the second type impurity is N-type ions.

3. The method according to claim 1, wherein the first type impurity is N-type ions and the second type impurity is P-type ions.

4. The method according to claim 1, wherein before forming a first well of a second type impurity in the high-voltage device region the method further comprises forming an oxide layer on the substrate.

5. The method according to claim 4, wherein after forming the third well the method further comprises removing the oxide layer.

6. The method according to claim 1, wherein before performing a field implantation of the second type impurity the method further comprises:

forming a pad oxide layer on the semiconductor substrate;

forming a silicon nitride layer on the pad oxide layer; and patterning the silicon nitride layer to expose a portion of the pad oxide layer.

7. The method according to claim 6, wherein the field oxide layers are formed on the exposed pad oxide layer.

8. The method according to claim 7, wherein after forming the field oxide layer the method further comprises removing the silicon nitride layer.

9. The method according to claim 1, wherein the first gate and the second gate include a polysilicon layer.

10. A method of fabricating a high-voltage device suitable for a low-voltage device, comprising:

providing a semiconductor substrate of a first type impurity in which a high-voltage device region and a low-voltage device region are defined;

forming a first well of a second type impurity in the high-voltage device region;

forming a plurality of second wells of the first type impurity within the first well and forming a third well of the first type impurity in the low-voltage device region wherein the second wells serve as a drift region of the high-voltage region;

performing a field implantation of the second type impurity to form a plurality of fourth wells of the second type impurity within the second wells;

forming a plurality of field oxide layers above the fourth wells in the high-voltage device region and above the semiconductor substrate in the low-voltage device region;

forming a first gate between the field oxide layers above the first well and forming a second gate between the field oxide layers above the third well; and forming a first source/drain region of the first type impurity between the field oxide layers within the second wells, forming a second source/drain region of the second type impurity within the third well beside the second gate, and forming a doped region of the first type impurity within the third well.

11. The method according to claim 10, wherein the first type impurity is P-type ions and the second type impurity is N-type ions.

12. The method according to claim 10, wherein the first type impurity is N-type ions and the second type impurity is P-type ions.

13. The method according to claim 10, wherein before forming a first well of a second type impurity in the high-voltage device region the method comprises forming an oxide layer on the substrate.

14. The method according to claim 13, wherein after forming the third well the method comprises removing the oxide layer.

15. The method according to claim 10, wherein before performing a field implantation of the second type impurity the method further comprises:

forming a pad oxide layer on the semiconductor substrate;

forming a silicon nitride layer on the pad oxide layer; and patterning the silicon nitride layer to expose a portion of the pad oxide layer.

16. The method according to claim 15, wherein the field oxide layers are formed on the exposed pad oxide layer.

17. The method according to claim 16, wherein after forming the field oxide layer further comprises removing the silicon nitride layer the method.

18. The method according to claim 10, wherein the first gate and the second gate include a polysilicon layer.

* * * * *